United States Patent [19]
Hase

[11] 4,399,396
[45] Aug. 16, 1983

[54] TWO LEVEL CONSTANT VOLTAGE FLOAT CHARGE RECTIFIER AND BATTERY SURVEILLANCE APPARATUS

[76] Inventor: Alfred M. Hase, 6 Manorwood Rd., Scarborough, Ontario, Canada

[21] Appl. No.: 289,278

[22] Filed: Aug. 3, 1981

[51] Int. Cl.³ .............................................. H02J 7/04
[52] U.S. Cl. ........................................ 320/43; 307/66
[58] Field of Search ...................... 307/64, 66; 320/43, 320/48, 57, 59

[56] References Cited

U.S. PATENT DOCUMENTS

| | | | |
|---|---|---|---|
| 3,267,288 | 8/1966 | Maiden et al. | 307/66 |
| 3,603,973 | 9/1971 | Hough | 307/66 |
| 3,848,173 | 11/1974 | Hase | 320/23 |
| 3,889,171 | 6/1975 | Hunter, Jr. | 320/31 |
| 4,017,724 | 4/1977 | Finger | 320/48 X |
| 4,025,916 | 5/1977 | Arnold et al. | 320/48 X |
| 4,242,627 | 12/1980 | Kisiel | 320/21 |
| 4,320,333 | 3/1982 | Hase | 320/43 |

*Primary Examiner*—William M. Shoop
*Attorney, Agent, or Firm*—Donald E. Hewson

[57] ABSTRACT

A two level, constant voltage float charge rectifier and battery surveillance apparatus is taught, having full-time battery and circuit operation surveillance. An electrical load and a battery are connected to the apparatus, in parallel, whereby the apparatus generally provides DC power directly to the load and maintains the battery on constant voltage float charge. In the event of an AC outage, the load is maintained from the battery. The apparatus automatically initiates a battery re-charging and equalization program if an AC outage is longer than a predetermined period, or in the event of deep discharge of the battery, or after a predetermined period of time (usually 30 days) since the last re-charging and equalization program. Constant surveillance includes an indication of the operation of the apparatus, including indication of low battery voltage, indication of a general failure alarm such as by failure of major components of the apparatus, and an indication at all times as to whether the apparatus is operating on a constant voltage float charge program or a battery re-charging and equalization program at a voltage level higher than the float charge level.

16 Claims, 3 Drawing Figures

TWO LEVEL CONSTANT VOLTAGE FLOAT CHARGE RECTIFIER AND BATTERY SURVEILLANCE APPARATUS

FIELD OF THE INVENTION

This invention relates to a current limiting, two-level constant voltage float charge rectifier and battery surveillance apparatus, particularly to such apparatus having a full-time battery and circuit operation surveillance. The apparatus of the present invention is generally of the station type; i.e., the apparatus of the present invention is generally intended for constant operation by providing current or EI limited direct current output to an electrical load and to a battery in parallel with the electrical load, from an alternating current input.

BACKGROUND OF THE INVENTION

Constant voltage float charge rectifier and battery surveillance apparatus is generally employed in installations where a DC operating load is constantly in operation, drawing EI regulated DC from a float charge rectifier, whose output is also connected to a battery in parallel with the load. Thus, in the event of failure of the AC input to the apparatus, the battery carries the load and continues to provide it with electrical energy, until such time as the supply of alternating current power to the apparatus is re-initiated. Such installations include remote installations where power is being provided for satellite transmission stations, pipeline surveillance apparatus, military or other high security installations; and, as well, in operations such as general telephone exchanges, computer installations and the like.

However, in all such installations, there are several requirements that are constant to such installations, and very often there are additional user-determined requirements that may also be necessary for the operation of the float charge rectifier and battery surveillance apparatus. These include such matters as maintaining a constant, full-time battery and circuit operation surveillance, including an indication as to the continuing supply of energy from the alternating current electrical energy source, and an indication as to whether the apparatus is at any instant of time in a constant voltage float charge mode or in a battery re-charging and equalization mode of operation.

Moreover, the apparatus may generally be required to provide an indication of battery low voltage, or of a general failure of the apparatus. Further, it is sometimes desireable that such indications or signals indicative of the presently existing operation status and/or alarm status should be transmitted to a remote alarm indicating station.

However, such apparatus has, in the past, generally comprised operating systems that are a combination of individually operating components, which are very often interfaced in such a manner that regulation is difficult and energy losses are significant.

Still further, it is desireable that there be a provision that there should be no current drain from the battery to the apparatus, except for the maintenance of system status indication circuits, during any outage of the AC source. Moreover, it is desireable, especially when two or more systems are in operation and connected to the same source of alternating current electrical energy, that there should be "soft" walk-in, or even a soft staggered walk-in, so as to preclude overloading the AC source. However, such requirements have not been well met previously, due to the hard connection of such float charge rectifier apparatus to the AC input source through fused safety disconnects or circuit breakers, except by the addition of extra electronic and/or magnetic circuit controllers.

It is particularly desireable that a battery re-charging and equalization program be initiated after any failure of the alternating current energy supply for more than a predetermined period of time, usually five minutes. Moreover, so as to maintain the battery in peak operating condition and efficiency, it is desireable in any event, and even when there has been no failure of the AC energy supply, that the battery be subjected to a re-charging and equalization program periodically. The length of such period has normally been determined to be 30 days but it may be longer or shorter.

Still further, it is desireable that a battery re-charging and equalization program should be initiated in the event that there has been deep discharge of the battery, even if there has not been an AC outage.

Generally, the period for battery re-charging and equalization is 8 to 12 hours, but depending upon the type of installation and circumstances surrounding it, it is desireable that the apparatus be adjustable to provide for a battery re-charging and equalization program of up to, say, twenty-four hours.

Finally, it is desireable, in all events, that the battery re-charging and equalization program be a substantially constant voltage program at a voltage which is higher than the normal float charge voltage for the battery.

Whether the electrical load connected to the constant voltage float charge rectifier and battery surveillance apparatus of the present invention is capable of operating at the higher re-charging and equalization voltage level as well as at the general float charge voltage level is essentially immaterial. Counter-EMF cells may be provided, or optional switching or other circuit means, whereby the load is protected from higher voltage in the event that it is necessary.

In any event, all of the above desireable features are provided, together with others, by the apparatus of the present invention, in a fully integrated operating circuit, to which may be added other circuit means which provide additional functions as may be required or desired, from time to time, and from installation to installation, depending upon the user's specific demands. For example, means are provided to manually initiate an equalization program at any time, and means may be provided to give an alarm indication upon sensing a battery low voltage, or means may even be provided to shut down the apparatus in the most unlikely event of circuit operation whereby the voltage output from the apparatus might increase beyond a predetermined level.

The present inventor has provided several circuits and apparatus for battery charging, in the past, including one having an initial constant, high current output, which then transfers to a taper (constant voltage) output, and finally to a trickle (constant current) charge. That battery charger is described in detail in Hase, U.S. Pat. No. 3,848,173, issued Nov. 12, 1974.

A further battery charger circuit, having full-time surveillance, is described in detail in U.S. Pat. No. 4,320,333, issued Mar. 16, 1982, to Alfred M. Hase.

As noted, the above patents relate to battery charging apparatus per se, having constant current, then constant voltage, then constant current output; whereas the present apparatus relates more particularly, in the battery charging and float charging modes, to constant voltage charging operation at a higher or lower voltage level, respectively.

However, the present invention also specifically provides an apparatus which has regard to energy efficient solid devices and transformers, with a view to energy saving and particularly to preclude unnecessary power losses during low load conditions or during AC outages, whereby better regulation may also be provided.

The above are broadly stated descriptions of certain of the features and functions of the apparatus of the present invention, discussed in greater detail hereafter.

In general terms, however, the present invention at least provides a current limiting, two level constant voltage float charge rectifier and battery surveillance apparatus which has full-time battery and circuit operation surveillance, and which is adapted for connection at its input to a source of alternating current electrical energy and at its output to an electrical load parallel with a storage battery, whereby the apparatus supplies electrical energy to the load when the source of electrical energy is connected and provides a constant voltage float charging to the battery at a first voltage level, and provides a battery re-charging and equalization program at a second voltage level which is higher than the first voltage level. The apparatus, in all events, comprises controllable synchronous switch means—discussed in greater detail hereafter—having a control coil, for controlling the rate of electrical energy input to the load which is in parallel with the storage battery, to which the apparatus is connected. The constant voltage float charging and constant voltage electrical energy input to the load, at the first voltage level, are continuous except when the apparatus is otherwise under control of a first, adjustable timing circuit. That adjustable timing circuit is adapted for setting a predetermined period of time and for controlling the battery re-charging and equalization program at a second voltage level which is higher than the first voltage level, during that predetermined period of time; and to automatically return to the constant voltage float charging and electrical energy supply program at the end of that predetermined period of time.

The apparatus further comprises adjustable fail-safe voltage sensing means; regulated fail-safe current limit sensing means; timer control cut-off means; and a general failure alarm circuit for detecting at least failure of the apparatus or of the source of electrical energy to the apparatus, and for generating a signal upon such failure. The regulated fail-safe current limit sensing means includes a zener diode in series with a diode and a potentiometer. The timer control cut-off means is such as to initiate a battery re-charging and equalization program so as to equalize the operating and sensed parameters of the apparatus following a predetermined delay after disconnection of the apparatus from the source of alternating current electrical energy, or failure of that source. Finally, in a minimum system according to the present invention, the adjustable fail-safe voltage sensing means drives shunt regulator means in parallel to the control coil of the controllable synchronous switch, so that the shunt regulator means drives the control coil by controlling the operating period thereof.

Other additional and/or optional features and operating sub-systems of the apparatus according to this invention, as well as the principles of operation, are set out hereafter.

BRIEF DESCRIPTION OF THE DRAWINGS

Indeed, the features and objects of the present invention are hereafter described in detail, in association with the accompanying drawings, in which.

DESCRIPTION OF THE PREFERRED EMBODIMENTS

Figure 1:
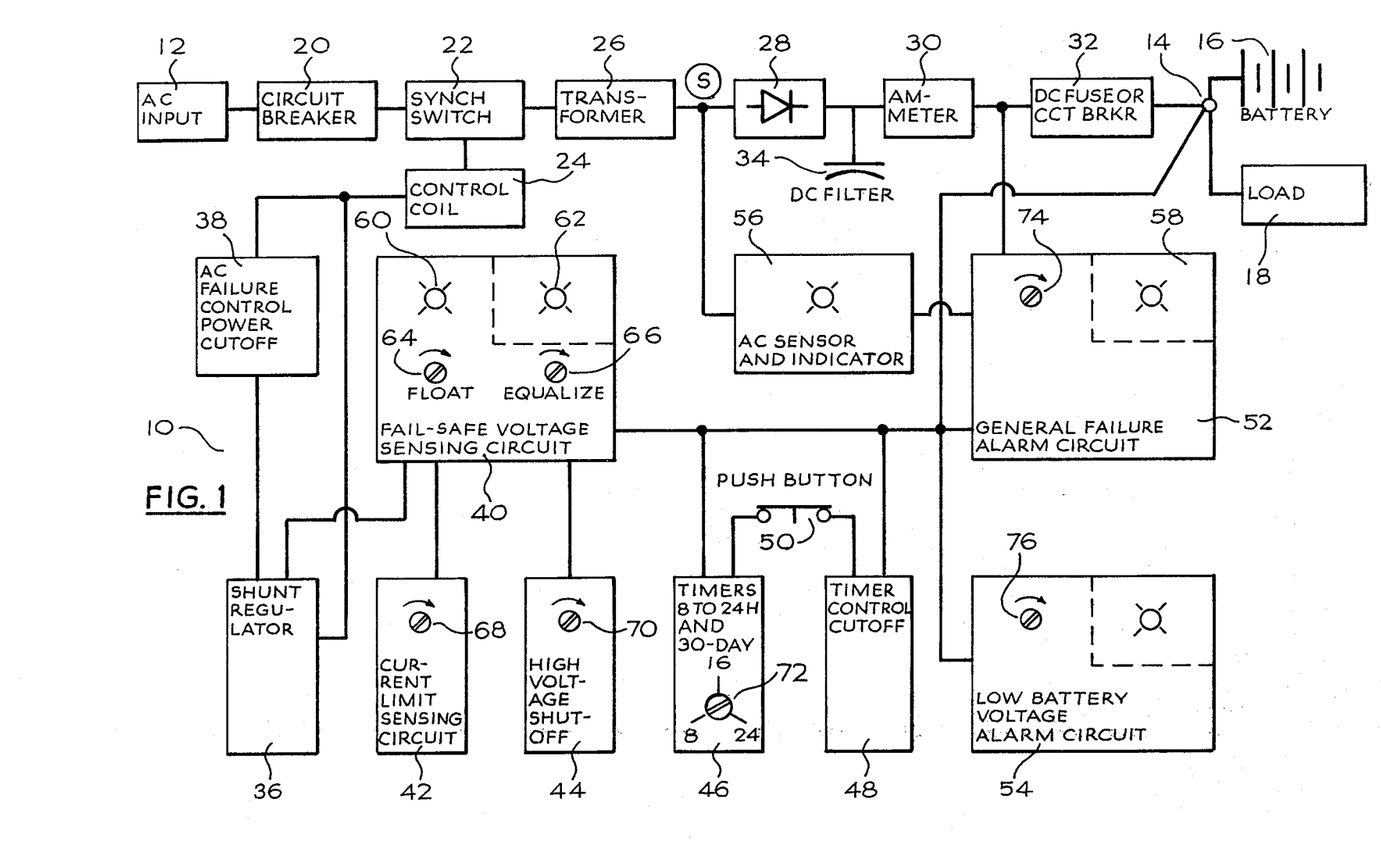
FIG. 1 is a single line block circuit diagram showing the basic circuitry and principal operating components of a float charge rectifier and battery surveillance apparatus according to the present invention.

As stated, FIG. 1 is a single line block circuit diagram which shows the principal operating components of a current limiting, two-level constant voltage float charge rectifier and battery surveillance apparatus, according to the present invention.

Figure 2:
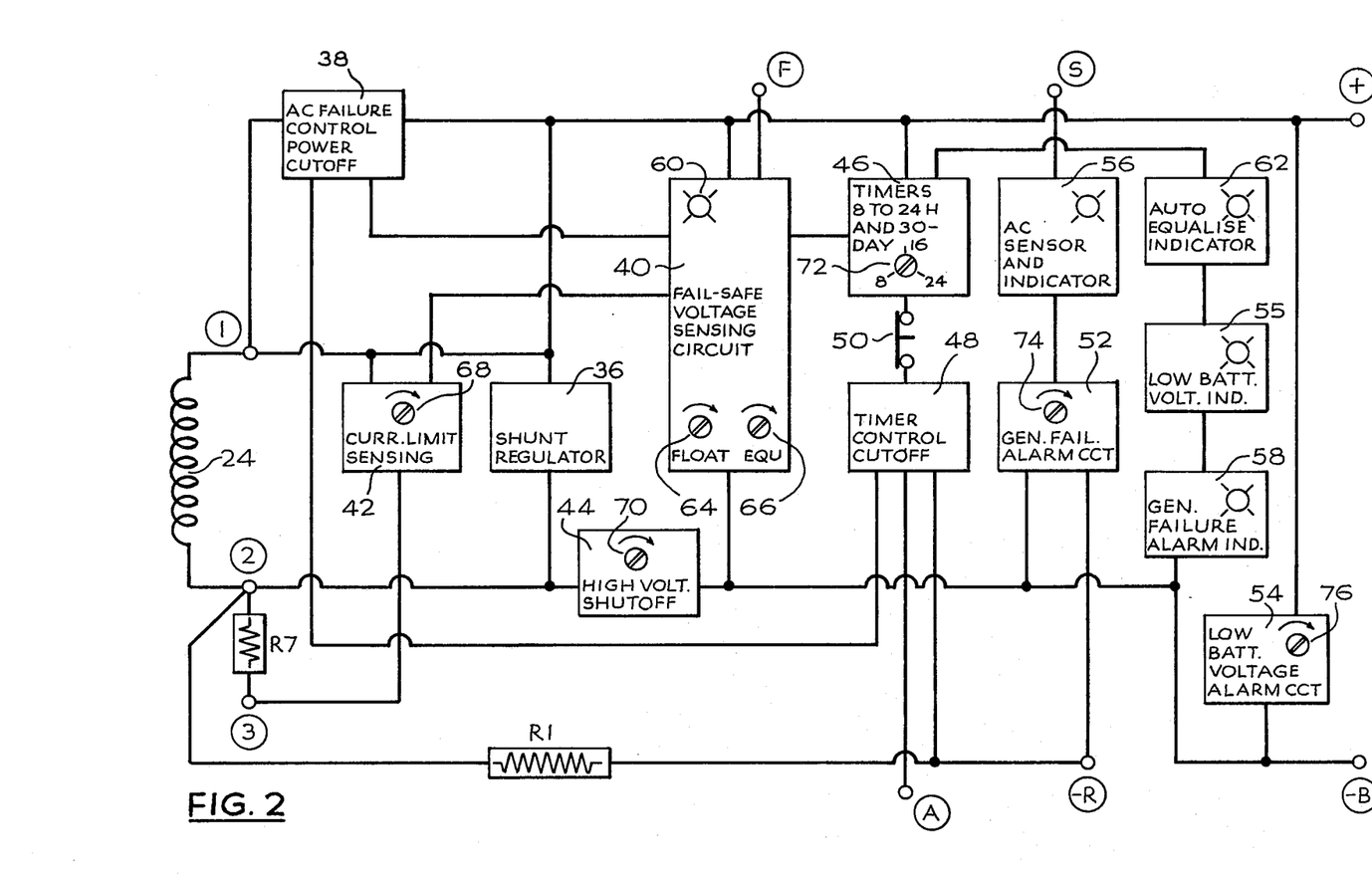
FIG. 2 is a block circuit diagram of the principal control module of a constant voltage float charge rectifier and battery surveillance apparatus according to the present invention.
Figure 3:
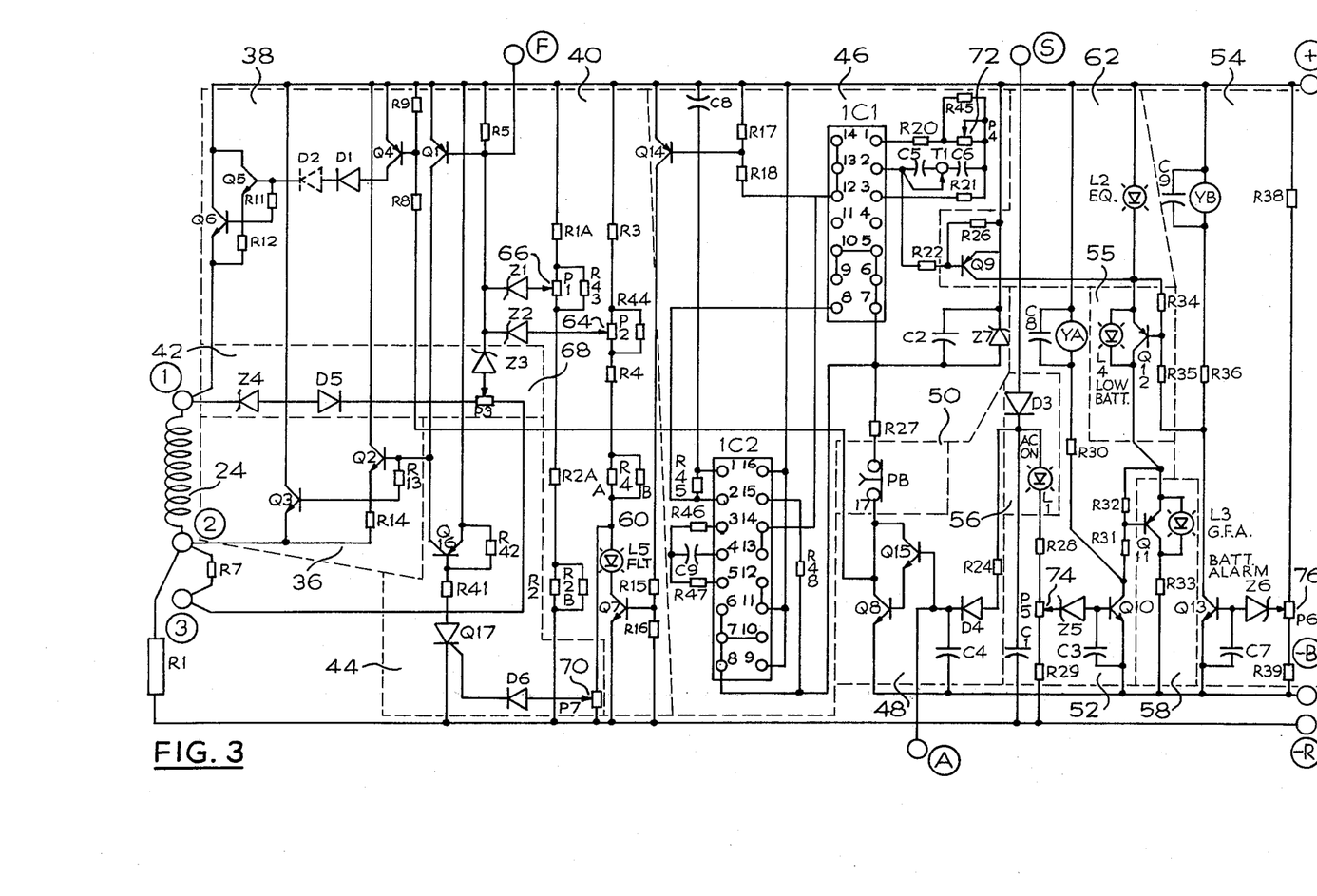
FIG. 3 is a typical schematic circuit of the control module of FIG. 2.

On the other hand, FIGS. 2 and 3 are each a two-line circuit diagram—i.e., showing either in block form or with respect to specific circuit components, properly electrically connected—which show the principal control module of a float charge rectifier and battery surveillance apparatus according to the present invention, and all of the circuit components identified in FIG. 2 are also identified in FIG. 3, most of them being also shown in FIG. 1 together with other standard circuit components of the apparatus.

Having regard to FIG. 1, it is seen that the apparatus 10 is adapted at its input for connection to a source of alternating current electrical energy 12. The output of the apparatus according to the present invention is a direct current voltage and one side of the output is connected as at a terminal 14 to a battery 16 and a load 18 which is in parallel to the battery 16. As will be discussed hereafter, the battery is constant float charged at a constant voltage, except when it is being re-charged and equalized at a higher voltage; and as discussed above, the load may at all times be directly connected to the output of the apparatus or additionally with counter-EMF cells or other apparatus.

Indeed, as will be discussed hereafter, several like apparatuses according to the present invention, and as shown in the Figures, may themselves be connected in parallel to the same load.

In the input section of the apparatus 10, there is a circuit breaker 20, which may also be a fused safety disconnect. Connected to it is a controllable synchronous switch means 22, usually a saturable reactor—but which may be alternatively a magnetic amplifier or the equivalent SCR circuitry—and which has a control coil 24, as discussed hereafter. So as to provide the corrent voltage at the output, and also so as to provide isolation, there is a transformer 26. A full wave rectifier 28 is connected through a DC ammeter 30 and a DC fuse or circuit breaker 32, to the output at 14.

A DC filter 34 may be provided, as discussed hereafter.

The control coil 24 of the controllable synchronous switch means (e.g., a saturable reactor) is connected to the principal operating module of the apparatus, as described in greater detail hereafter with respect to FIGS. 2 and 3. One of the components of the principal operating module is a shunt regulator 36, which controls the rate of electrical energy input to the control coil and thereby the rate of electrical energy output of the apparatus. That control is discussed in greater detail hereafter, and is generally as taught in Hase Canadian Pat. No. 822,798, issued Sept. 9, 1969.

The control coil 24 may also be connected to an AC failure control power cut-off circuit 38, as discussed hereafter.

The shunt regulator 36 is controlled by an adjustable fail-safe voltage sensing circuit 40, to which is also connected an adjustable current limit sensing circuit 42. There may also be connected to the fail-safe voltage sensing circuit 40 an adjustable high voltage shut-off circuit 44; but such circuit is not generally required although it is shown and referred to in FIGS. 2 and 3 discussed hereafter.

The adjustable fail-safe voltage sensing circuit 40 is yet further connected to a timer circuit sub-module 46, which includes an adjustable eight to twenty-four hour timer, and a thirty day timer; and also to a timer control cut-off circuit 48. A manual push button switch 50 is connected between the timer circuit sub-module 46 and the timer control cut-off 48.

Still further, the adjustable fail-safe voltage sensing circuit 40 is connected to a general failure alarm circuit 52, and to a low battery voltage alarm circuit 54; and, of course, the adjustable fail-safe voltage sensing circuit 40, the general failure alarm circuit 52 and the battery voltage alarm circuit 54 are all connected to the DC output of the apparatus at 14.

The lower battery voltage alarm circuit 54 has associated with it a low battery voltage indicator 55.

An AC sensor and indicator circuit 56 is connected in the AC side of the apparatus, generally at the output side of the transformer 26; and the AC sensor and indicator circuit 56 is also connected to the general failure alarm circuit 52.

In general terms, the controllable synchronous switch means 22 having a control coil 24 is such that its operation is affected by the control coil, whereby the rate of electrical energy input to the transformer 26, and thence to the output of the apparatus, may be controlled. The rate of electrical energy input to the transformer 26 is determined by the state of conductance of the control coil 24, and the period—length of time—of such conductance. Thus, when the power input to the controllable synchronous switch 22 reduces under the influence of the control coil 24, whose conductance is controlled in the manner discussed hereafter, it may be considered that the average period of the conductance of the control coil 24 is reducing.

From the above, it follows that the rate of electrical energy input to the electrical load and to the storage battery is under control; and it will be seen that the constant voltage float charging and constant voltage electrical energy input to the load are at a first voltage level, except when the apparatus is otherwise under control of the eight to twenty-four hour timer circuit as discussed hereafter.

The timer control cut-off circuit 48 simply provides a means whereby the battery re-charging and equalization program, discussed hereafter, may be initiated so as to equalize the operating and sensed parameters of the apparatus, as may be necessary.

The general failure alarm circuit 52 also has an indicator 58 associated with it, and its purpose is particularly to detect a failure of the apparatus or of the AC input source 12, and to generate a signal upon such failure. Such signal may, among other things, cause illumination of the indicator 58, as discussed hereafter.

There are associated with the adjustable fail-safe voltage sensing circuit 40 two indicators 60 and 62, one of which provides an indication when the apparatus is in its float-charging mode, and the other of which provides an indication when the apparatus is in the battery re-charging and equalization mode, as discussed hereafter.

The fail-safe voltage sensing circuit 40 shows two adjustment input means 64 and 66; current limit sensing circuit 42 shows an adjustment means 68; the high voltage shut-off circuit 34 shows an adjustment means 70; the timer sub-system module 46 shows an adjustment means 72; the general failure alarm circuit 52 shows an adjustment means 74; and the low battery alarm circuit 54 shows an adjustment means 76. All of those adjustment means—generally shown as a screw head in FIGS. 1 and 2—are related specifically to circuit components in FIG. 3, hereafter.

Turning now to FIGS. 2 and 3, they are a functional or block circuit diagram, respectively, and a typical circuit diagram showing specific components of certain specific circuit features of FIG. 1. FIGS. 2 and 3 are included in the present discussion to more specifically describe the present invention, and to show a number of the alternative and optional features in respect of its operation and functions.

Each of the circuit components broadly shown in FIG. 1 and which has been more specifically referred to in FIG. 2 is outlined by chain line in FIG. 3. Moreover, each of the adjustment means referred to in FIGS. 1 and 2 are specifically related to potentiometers detailed in FIG. 3, where like reference numerals relate to the specific component in each case.

It should be noted that, except where it is evident from the context, a discussion of FIG. 2 hereafter includes a discussion of FIG. 3, and vice-versa.

It will be noted in FIGS. 2 and 3 that certain terminals have been designated, and that certain specific circuit components have been shown in each of those Figures. Thus, it is noted that the control coil 24 is connected between terminals designated 1 and 2; and that connected also to terminal 2 is a resistor R1 which is connected at its other end to a terminal designated "−R". Resistor R7 is shown in place between terminals 2 and 3. It should also be noted that the DC fuse or circuit breaker 32 is connected in the circuit of FIGS. 2 and 3 between the terminals indicated "−R" and "−B".

There are several other terminals indicated, including the positive DC output terminal, designated "+", a negative terminal designated "−B"; and three other terminals designated "A", "F" and "S".

Considering first the current limit sensing, which is adjustable at potentiometer P3 (68), it is noted that the current limit sensing circuit comprises diode D5 and zener diode Z4, in series with the potentiometer P3. Zener diode and diode D5 are in back-to-back relationship. The current limit sensing circuit 42 is connected across terminals 1 and 3, and makes a series connection with the control coil 24 through resistor R7. The resistance of the resistor R7 is determined by the nominal rated operating voltage of the control coil 24.

It is obvious that there is also inherent current limiting in the circuits of FIGS. 2 and 3, because of the resistance R1 being in series with the coil 24. Thus, even if there should be a failure of the current limit sensing circuit 42, the apparatus is in any event fail-safe because there is still current limiting by virtue of R1 being in place.

Moreover, there is temperature compensation of the control coil because of the presence in the current limit sensing string of the zener diode Z4 in combination with diode D5. As the temperature of the control coil varies, so also do the current requirements of the control coil vary. However, the current limit sensing follows the change of temperature and the control current requirements because of Z4, thereby providing an indirect temperature compensation for the coil temperature, so that current limit sensing is effective at all operating temperatures of the coil. Thus, the current sensing and monitoring function of the apparatus is substantially accurate at all operating temperatures of the control coil 24.

The fail-safe voltage sensing circuit 40 comprises a float string including indicator 60 and potentiometer P2 (64); and an equalization string including potentiometer P1 (66). All of the circuit components are chosen to be fail-safe; that is, in the event that they should fail, they would fail closed. For example, if transistor Q7 fails, it would fail closed, and the circuit operation would remain on float charging. If transistor Q1 or zener diode Z2 were to fail, the output of the circuit would go to a low output, even below the float level output; and any battery re-charge and equalization program that might have been in operation would be terminated, and no such operation could be initiated in the event of failure of Q1 or Z2. Any circuit component failure is quite unlikely, and if a failure does occur, it is essentially unknown for failure to occur where the component opens rather than closes.

In any event, if any component opened, then the circuit would fail to equalize.

In the unlikely event that the equalize string should fail open (such as by breakage of a wire), then the high voltage shut-off circuit 44 would become operative, whereby the operation of the shunt regulator circuit 36 would be driven to minimum operation, as discussed hereafter.

Likewise, if the equalisation string including potentiometer P1 (66) fails to a closed position, which would be the usual case, the operation of the shunt regulator 36 would go to a minimum.

The time circuit sub-module 46 has at least one timer circuit by way of an integrated circuit IC1, which is adjustable through potentiometer P4 (72) to set and control a predetermined period of time of from eight to twenty-four hours, during which the battery re-charging and equalization program at a higher voltage level than the float charging voltage level is carried on. The adjustment of the voltage levels is determined by potentiometers P1 (66) for the equalize voltage level and P2 (64) for the float voltage level, in the fail-safe voltage sensing circuit 40. At the end of the operating period of the eight to twenty-four hour timer under the control of IC1, the operation of the circuit is automatically returned to the constant voltage float charging and electrical energy supply program, whereby voltage at the lower, float charge level determined by the setting of potentiometer P1 (66) appears at the output of the circuit.

When, however, a circuit includes the integrated circuit IC2, that integrated circuit is a second timer circuit which is arranged for operation at intervals following a predetermined period of time greater than the operating predetermined period of time of the first timer circuit IC1, or earlier upon predetermined alarm conditions, so as to initiate the battery re-charge equalization program. That is to say, the timer circuits are interfaced so that IC1 always turns on first, and it begins an equalization and battery re-charging program for the predetermined period of time as determined by the setting of potentiometer P4 (72). However, the arrangement is such that IC2 will, every thirty days as a general rule, unless it has become operative for other reasons, initiate the battery re-charging and equalization program, and at the same time it will re-set the first timing circuit IC1 to zero.

Other predetermined conditions which may cause a battery re-charging and equalization program are upon manual re-setting of the push button 50—upon, say a periodical visit by a supervisory person to the station where the apparatus is in operation—or upon disconnection of the apparatus such as by opening either of the AC fused disconnect or circuit breaker, or the DC fuse or circuit breaker or failure of the source of alternating current electrical energy.

In the latter case, a battery re-charging and equalization program is not necessary if the failure has only been for a very short period of time. However, if the failure is for a period of more than, say, five minutes, then the power control cut-off circuit 48 comes into operation. In that case, the period of time is determined by the capacitance of capacitor C4, and the length of time it takes that capacitor to discharge. If the timer control cut-off 48 becomes operative, then once again IC1 is restarted and reset to zero, whereby a battery re-charge and equalization program is initiated.

Yet another alarm or off-nominal circuit condition which may cause initialization of IC1 and a battery re-charge and equalization program, is in the event of a deep discharge of the battery.

The general failure alarm circuit 52 includes a relay YA. In the event that the DC fuse or circuit breaker 32 is detected to be open, at which time the relay YA would fall out, an alarm indication is made at indicator 58 including LED L3. That indication occurs because of the slaving arrangement of transistor Q11 to Q10 such that if Q10 opens, Q11 opens and L3 illuminates.

Likewise, the general failure alarm circuit 52, through potentiometer P5 (74) may be adjusted to give an alarm indication in the event of an AC failure or opening of the AC fused safety disconnect or circuit breaker, because terminal "S" in FIGS. 2 and 3 is, in fact, connected at the output side of the transformer 26 as indicated in FIG. 1.

Other general failure alarm indications would be as a consequence of a major component failure, or of the control circuit failing to low output (either low current or low voltage).

It should be noted that the presence of diode D3 in series with the AC sensing from terminal "S" is such that failure of the AC side, or indeed lockout of the DC fuse or circuit breaker 32, is sensed and noted without the use of a series isolating diode in the DC side of the circuit, as has been the case in the prior art. There is, therefore, no energy loss because a series isolating diode has been eliminated; and it has been noted that there can be considerable energy loss due to heat loss in such series isolating diodes.

It should also be noted that, because of the illumination of isolating diodes in the DC side, there is no regulation error due to diode offset at low loads. Moreover, especially in the case of remote sensing, individual sensing of the failure of a specific one of two or more parallel connected circuits 10 according to this invention may be sensed, because of the presence of diode D3 in each respective circuit. This is because the AC sensing and indicating circuit 56 including the light emitting diode L1, for each apparatus 10, may be arranged so that the signal which is indicative of continuing input of alternating current electric energy to each apparatus 10—the continuing illumination of the respective LED L1—may also be slaved to other signalling apparatus for remote indication.

It has been noted that the circuit of the constant voltage float charge rectifier and battery surveillance apparatus of the present invention may also include an AC failure control power cut-off circuit means 38. When such AC failure control power cut-off means is included in the circuit, then it functions as a series cut-off for the shunt control regulator 36. If the AC failure control power cut-off circuit 38 operates, it opens the circuit particularly at Q6 thus isolating the control coil 24 and the resistor R1. In that manner, current drain from the battery to the control coil 24 and the resistor R1 is precluded, thereby permitting more efficient utilization of energy delivered from the battery 16 for purposes of continuing the operation of the load 18.

Yet another advantage comes by virtue of the interconnection of the AC failure control power cut-off circuit 38 and the timer control cut-off 48, through the fail-safe voltage sensing circuit 40. It has been noted that, in the event of an AC power outage or disconnection of the circuit from the AC power source for greater than a predetermined period of time, the length of that predetermined period of time is dependent upon the capacitance of capacitor C4. Likewise, upon re-initiation of the circuit operation, capacitor C4 must recharge, and as it is charging, transistors Q8 and Q15 are closed but, transistors Q4, Q5 and Q6 remain open and gradually close as C4 re-charges, until they become saturated. Thus, soft walk-in of the circuit is achieved because the control coil 24 can only conduct limited amounts of current depending upon the saturation state of Q6, in particular, so that a period of time expires before the control coil 24 is receiving the full current that it demands.

Indeed, additional external capacitors can be added at terminal "A", whereby an even longer walk-in may be controlled. Thus, in the event that there are two or more parallel connected float charged rectifier circuits 10, each in accordance with this invention, the order and length of time that they come back into operation following an AC outage can be determined and set, so as not to overstress the AC source or the disconnects or the circuit breakers in series with it.

Several other circuit features are illustrated, the operation of which is quite evident. For example, the low battery voltage alarm circuit 54, sensitivity of which is determined at potentiometer P6 (76), includes a relay YB. In the event of low battery voltage, relay YB drops out, and transistor Q12 which is slaved to transistor Q13 opens, permitting illumination of light emitting diode L4 in the low battery voltage indicator circuit 55.

At any time that the equalization and battery recharging program is operating, an indication is given by virtue of the illumination of light emitting diode L2, under control of transistor Q9.

It is possible to provide for feedback regulation, by connection of a high resistance resistor from terminal "F" to terminal 2.

Likewise, especially in the event of operation of unfiltered circuits, better regulation can be obtained by connection of a relatively small capacitor from terminal "F" to the positive DC output terminal "+", of the circuit.

Moreover, it is evident that remote alarm signalling and indication is possible, by virtue of the provision of additional alarm signalling or sensing means across any of the status or alarm indicators L1, L2, L3, L4 or L5.

From the above, it is seen that no relays are used in the voltage sensing circuits, and that the circuits are fail-safe with built-in redundancy at all stressed points.

It has been demonstrated that, even though the high voltage shut-off circuit 44 is shown, it is not required, because the circuits components are all such that they would fail closed rather than open.

Soft walk-in is provided for in the event of AC input failure; and moreover, staggered walk-in of parallel float charger and rectifier circuits 10 according to this invention may be provided for by additional external capacitors, as discussed.

Thus there is provided hereby a float charger and rectifier apparatus which has control, surveillance, alarm signalling and status reporting, with automatic re-charging and battery equalization in the event of AC voltage failure for more than a predetermined period of time (say five minutes), and in any event after a predetermined period of time during which there has been no battery re-charging and equalization program (say thirty days). A manual override is provided, whereby re-charging and battery equalization may be initiated at any time, by physically manipulating a push-button switch on the apparatus.

Given that the apparatus of the present invention would normally be connected to ordinary lead acid storage batteries, the following are indicative of the operation of circuits according to the present invention.

Assuming that the nominal voltage of a battery is 2.0 volts per cell, the equalization voltage output of the circuit may be set to, say, 2.25 to 2.35 volts per cell; and the float charging voltage output may be set to, say, 2.105 to 2.2 volts per cell.

Likewise, the high voltage shut-off circuit 44 may be set to operate at a voltage of about 2.4 volts per cell; and similarly, the low battery voltage alarm circuit 54 may be set to operate at a battery terminal voltage of 1.85 to 2.00 volts per cell.

Also, the general failure alarm circuit may be set for alarm status, driving the shunt control to minimum, in the event of a battery terminal voltage of approximately 1.85 volts per cell, so that the circuit can be set to a fail-safe condition at that battery terminal voltage.

The current limit sensing circuit 42 may be set to 80% to 110%, plus or minus 2%, of the rated constant current of the control coil 24. Moreover, addition of a high resistance resistor from terminal 2 to terminal "F" may provide up to a 1% slope adjustment by positive feedback.

Circuits according to the present invention can be designed, using the appropriate and correct components, for operation at from 12 to 250 volts DC; and can be provided for regulation of loads from 100 watts up to 500 KW.

The length of time of the battery re-charging and equalizing program may be pre-set for from eight to twenty-four hours; and the automatic re-charging and equalization program may be arranged for every thirty days or such other period as is determined to be practical and useful.

Likewise, the period of time after which the timer control cut-off circuit 48 becomes operative, may be determined by the size of capacitors C4, and soft walk-in may be staggered by the use of additional external capacitors connected to terminal "A".

The connection in the AC sensor and indicator circuit 56 of diode D3 to terminal "S", precludes the necessity for the use of diodes in the DC circuits; thereby precluding regulation inaccuracies due to diode offset at low loads, and also eliminating energy losses across such diodes.

All of the above discussion has related to a current limiting, two-level constant voltage float charge rectifier and battery surveillance apparatus, which has full-time battery and circuit operation surveillance and control, with alarm and status signalling and reporting provisions. A commercially operating circuit has been shown, in respect of a particular operating model, but the circuits are illustrative and are not definitive as to the precise manner of presentation thereof. The functional block diagrams which have been shown in the present application are with respect to the general layout of circuits according to the present invention, and specific circuit integers would obviously be chosen according to the operating characteristics, load requirements, voltage, and choice of additional or optional alarm or cut-off features; but all are within the meaning and scope of the appended claims.

What is claimed is:

1. A current limiting, two-level constant voltage float charge rectifier and battery surveillance apparatus having full-time battery and circuit operation surveillance, and adapted for connection at its input to a source of alternating current electrical energy and at its output to an electrical load in parallel with a storage battery, for supplying electrical energy to said load when said source of electrical energy is connected and for constant voltage float charging said battery at a first voltage level and for battery re-charging and equalization at a second voltage level higher than said first voltage level; comprising:

controllable synchronous switch means having a control coil, for controlling the rate of electrical energy input to an electrical load in parallel with a storage battery to which said apparatus is connected, and for constant voltage float charging said battery and constant voltage electrical energy input to said load at a first voltage level, except when otherwise under control of a first, adjustable timing circuit;

said first, adjustable timing circuit being adapted for setting a predetermined period of time and for controlling a battery re-charging and equalization program, including a constant voltage charging at a second voltage level higher than said first voltage level, during said predetermined period of time; and for automatically returning to said constant voltage float charging and electrical energy supply program at the end of said predetermined period of time;

adjustable fail-safe voltage sensing means;
regulated fail-safe current limit sensing means;
timer control cut-off means; and, general failure alarm circuit means for detecting at least failure of said apparatus or of the source of alternating current electrical energy to said apparatus, and for generating a signal upon such failure;

said regulated fail-safe current limit sensing means including a zener diode in series with a diode and a potentiometer;

said timer control cut-off means being such as to initiate a battery re-charging and equalization program so as to equalize the operating and sensed parameters of said apparatus following a predetermined delay after disconnection of said apparatus from said source of alternating current electrical energy, or failure thereof; and, said adjustable fail-safe voltage sensing means driving shunt regulator means in parallel to said control coil; said shunt regulator means driving said control coil of said controllable synchronous switch means by controlling the operating period of said control coil.

2. The apparatus of claim 1, further comprising a second timing circuit;

said second timing circuit being connected with said first timing circuit and arranged for operation at intervals following a predetermined period of time greater than the operating predetermined period of time of said first timing circuit, or earlier upon predetermined alarm conditions affecting said apparatus or said battery, so as to initiate an equalization and battery re-charge program so as to equalize the operating and sensed parameters of said apparatus, and so as to reset said first timing circuit to zero; and thereafter to return to said constant voltage float charging and electrical energy supply program.

3. The apparatus of claim 1, where said regulated fail-safe current limit sensing means comprises a further resistor in series with said control coil, and said zener diode and diode in series with said potentiometer are in back-to-back series connection; whereby the current requirements of said control coil, which vary with the temperature of the control coil, are temperature compensated, so that the current sensing and monitoring function of said apparatus is substantially accurate at all operating temperatures of said control coil.

4. The apparatus of claim 1, further comprising a control coil power cut-off circuit means, which functions in the event of failure of the source of alternating current electrical energy to preclude DC current drain from said battery during discontinuance of alternating current electrical energy input to said apparatus, by disconnecting said battery from said control coil.

5. The apparatus of claim 1, further comprising a sensing terminal and diode in series therewith, connected to said source of alternating current electrical energy, and thereby to provide a signal indicative of the continuing input to said apparatus of electrical power from said source of alternating current electrical energy.

6. The apparatus of claim 1, further comprising an adjustable high voltage cut-off circuit means arranged to drive said controllable synchronous switch means to minimum output in the event that the output voltage of said apparatus becomes greater than a predetermined maximum voltage.

7. The apparatus of claim 1, further comprising adjustable battery voltage sensing and alarm circuits arranged for sensing battery terminal voltage and for causing an alarm signal in the event that said battery terminal voltage falls below a predetermined minimum battery terminal voltage.

8. The apparatus of claim 1 or 2, including indicator means for giving a visual indication whenever said equalization and battery re-charge program is operating.

9. The apparatus of claim 1 or 2, including indicator means arranged for giving a visual signal whenever said constant voltage float-charging and electrical energy supply program at said first voltage level, is in operation.

10. The apparatus of claim 1, where said signal from said general failure alarm circuit means is adapted for transmission to a remote alarm indicating location.

11. The apparatus of claim 7, where said low battery voltage alarm circuit includes means for generating a signal adapted for transmission to a remote alarm indicating location.

12. The apparatus of claim 5, where said signal indicative of continuing input to said apparatus of electrical power from said source of alternating current electric energy is adapted for transmission to a remote alarm indicating location.

13. The apparatus of claim 4, where said timer control cut-off means includes capacitor means which drives said control coil power cut-off circuit means in such a manner that, upon re-initiation of delivery of alternating current electrical energy to said apparatus, said control coil power cut-off circuit means gradually closes to full conduction, thereby permitting soft walk-in of said apparatus to a full re-connection thereof to said source of alternating current electrical energy.

14. The apparatus of claim 1, including a positive direct current voltage terminal at the output of said apparatus, and capacitor filter means connected between said positive direct current voltage terminal and said voltage sensing circuit means.

15. The apparatus of claim 1, where the connection of said apparatus to said control coil has a negative terminal, and a high resistance is connected between said negative terminal and said voltage sensing means so as to provide a feedback circuit whereby said control coil of said controllable synchronous switch means is driven in such a manner as to have feedback regulation thereof.

16. The apparatus of claim 1, where said controllable synchronous switch means is an ampere-turns transductor having a control coil; and where said shunt regulator means driving the control coil of said controllable synchronous switch means includes a circuit parallel to said control coil, including voltage reference sensing means and at least one transistor in shunt connection across said control coil; said voltage reference sensing means being connected to drive the base of said transistor when current flow occurs in said voltage reference sensing means so as to control the saturation level of said at least one transistor, and thereby so as to control the trigger rate of said controllable synchronous switch, until said transistor base is driven substantially to full saturation.

* * * * *